US009733574B2

(12) United States Patent
Chen et al.

(10) Patent No.: US 9,733,574 B2
(45) Date of Patent: Aug. 15, 2017

(54) MULTIPLE PHASE-SHIFT PHOTOMASK AND SEMICONDUCTOR MANUFACTURING METHOD

(71) Applicant: Cypress Semiconductor Corporation, San Jose, CA (US)

(72) Inventors: Gong Chen, San Jose, CA (US); Frank Tsai, Mountain View, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 384 days.

(21) Appl. No.: 14/056,547

(22) Filed: Oct. 17, 2013

(65) Prior Publication Data

US 2015/0109594 A1    Apr. 23, 2015

(51) Int. Cl.
*G03B 27/52* (2006.01)
*G03F 7/20* (2006.01)
*G03F 1/26* (2012.01)

(52) U.S. Cl.
CPC ............ *G03F 7/70283* (2013.01); *G03F 1/26* (2013.01); *G03F 7/2012* (2013.01); *G03F 7/70191* (2013.01)

(58) Field of Classification Search
CPC ......... G03F 1/0046–1/0084; G03F 1/26–1/34; G03F 1/46; G03F 7/70191; G03F 7/70325; G03F 7/70416; G03F 7/70283
USPC ............... 355/52, 53, 55, 67–71, 75–77; 250/492.1, 492.2, 492.22, 493.1, 548; 430/5, 8, 22, 30, 311, 312, 394
See application file for complete search history.

(56) References Cited

U.S. PATENT DOCUMENTS

| 5,302,477 A * | 4/1994 | Dao | G03F 1/29 430/311 |
|---|---|---|---|
| 5,536,604 A * | 7/1996 | Ito | G03F 1/32 430/321 |
| 5,549,995 A * | 8/1996 | Tanaka | G03F 1/30 430/322 |
| 5,592,259 A * | 1/1997 | Anzai | G03F 7/70241 355/53 |
| 5,700,605 A * | 12/1997 | Ito | G03F 1/30 430/322 |
| 5,851,701 A * | 12/1998 | Rolson | G03F 1/26 430/5 |
| 6,902,851 B1 * | 6/2005 | Babcock | G03F 1/44 430/394 |
| 7,014,962 B2 * | 3/2006 | Lin | G03F 1/32 430/311 |

(Continued)

*Primary Examiner* — Christina Riddle

(57) ABSTRACT

Manufacturing of semiconductor devices often involves performed photolithography to pattern and etch the various features of those devices. Such photolithography involves masking and focusing light onto a surface of the semiconductor device for exposing and etching the features of the semiconductor devices. However, due to design specifications and other causes, the semiconductor devices may not have a perfectly flat light-incident surface. Rather, some areas of the semiconductor device may be raised or lowered relative to other areas of the semiconductor device. Therefore, focusing the light on one area causes another to become unfocused. By carefully designing a photomask to cause phase shifts of the light transmitted therethrough, focus across all areas of the semiconductor device can be achieved during photolithography, which results in sharp and accurate patterns formed on the semiconductor device.

13 Claims, 7 Drawing Sheets

(56) References Cited

U.S. PATENT DOCUMENTS

| | | | | |
|---|---|---|---|---|
| 2005/0100798 A1* | 5/2005 | Lin | ............................ | G03F 1/50 |
| | | | | 430/5 |
| 2007/0238032 A1* | 10/2007 | Murano | ..................... | G03F 1/32 |
| | | | | 430/5 |
| 2011/0027703 A1* | 2/2011 | Shoki | ...................... | B82Y 10/00 |
| | | | | 430/5 |

* cited by examiner

MULTIPLE PHASE-SHIFT PHOTOMASK AND SEMICONDUCTOR MANUFACTURING METHOD

BACKGROUND

Technical Field

The disclosure relates generally to a photolithography process for manufacturing semiconductor devices, and specifically to a photomask capable of adjusting focal planes among different regions of the semiconductor devices, and a method of manufacturing the semiconductor devices using the photomask.

Related Art

In conventional semiconductor manufacturing methods, photomasks are used during photolithography in order to expose a semiconductor wafer to a pattern of intense light. This exposure causes a pattern to be formed on the semiconductor wafer, which alone or in combination with additional exposures (using the same or different photomask), can form the basis of the integrated circuit to formed on the semiconductor wafer. After the exposure, etching and/or deposition can be performed in order to form the circuit elements in the semiconductor wafer.

Conventional photomasks included a transparent baseplate having opaque elements corresponding to areas that are not to be exposed. The advent of smaller semiconductor features have necessitated the use of phase-shifting photomasks. Such phase-shifting photomasks are specifically designed only to allow for passing light to exit the photomask with either a zero degree phase shift (in exposure areas) or a 180 degree phase shift (in non-exposure areas).

BRIEF DESCRIPTION OF THE DRAWINGS/FIGURES

Embodiments are described herein with reference to the accompanying drawings. In the drawings, like reference numbers generally indicate identical or functionally similar elements. Additionally, generally, the left most digit(s) of a reference number identifies the drawing in which the reference number first appears.

DETAILED DESCRIPTION

Lithography Apparatus and System Properties

Figure 1:
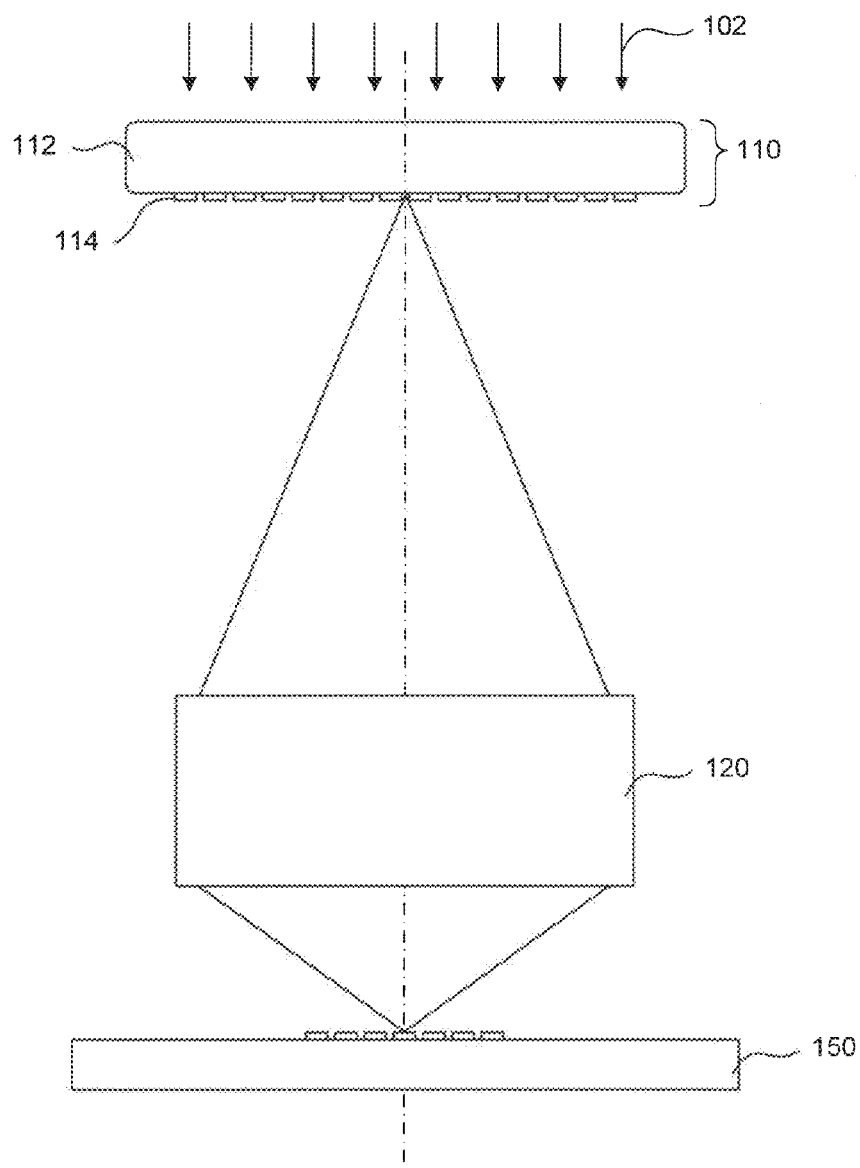
FIG. 1 illustrates an exemplary photolithography apparatus using a photomask according to an exemplary embodiment.

FIG. 1 illustrates a photolithography apparatus 100 according to an exemplary embodiment.

The apparatus 100 includes a photomask 110 that receives incident light 102 from a light source (not shown). The photomask 110 includes a substrate 112 with an absorber 114 disposed on a light-exit surface. In an embodiment, the substrate 112 is a quartz blank and the absorber 114 is represented by a MoSI. Conventionally, light that passes through the substrate 112 without passing through the absorber 114 passes through with 100% or near 100% transmission and a 0 degree phase shift. On the other hand, light that passes through both the substrate 112 and the absorber 114 of conventional photomasks passes through with approximately 6-8% transmission and a 180 degree phase shift. The exemplary photomask 110 differs from the conventional photomask, as will be described in detail below.

Once the light passes through the photomask 102, the light proceeds to a projection lens 120, which focuses the incoming light onto a wafer 150 surface. The focusing of the light on the wafer 150 surface causes the surface of the wafer 150 to be etched, thereby forming a desired structural pattern thereon.

In many respects, performing photolithography is akin to taking a photograph. The point or plane at which the light is focused produces a clear and sharp picture, whereas other points/planes are blurred. The corresponding consequence in photolithography is that only a focal plane of the projection lens 120 produces a sharp pattern that closely corresponds to a desired pattern. However, due to differences in layer structures among different regions of the wafer 150, the entire surface of the wafer 150 may not lie in the same focal plane.

Figure 2:
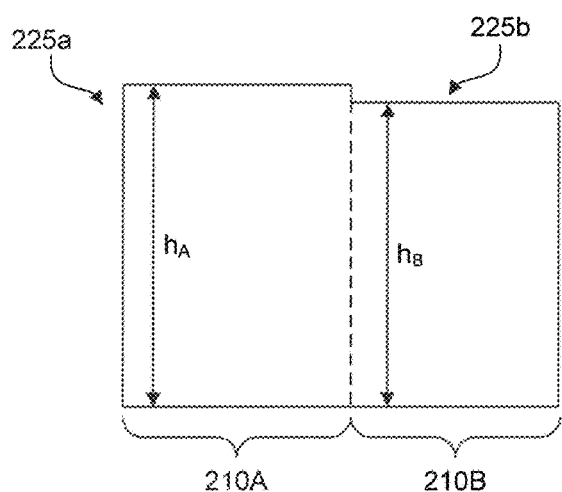
FIG. 2 illustrates an exemplary semiconductor device to be manufactured using the photomask according to an exemplary embodiment.

For example, FIG. 2 illustrates a cross-sectional view of a portion of an exemplary semiconductor wafer 150. As shown, the wafer 150 includes a first area 210A and a second area 210B. In the first area 210A, a first layer stack 225a has a height $h_A$. Meanwhile, in the second area 210B, a second layer stack 225b has a height $h_B$, where $h_A \neq h_B$. The difference in height between the first area 210A and the second area 210B generally is attributed to differences in the number of, or general layout of, the layers among the first layer stack 225a and the second layer stack 225b. However, other factors (by design or circumstance) are conceivable, and can be corrected for provided that they are known or can be measured prior to photolithography. Because of the differences in height among the areas of the wafer 150, some areas of the wafer 150 may fall outside the focal plane of the projection lens, thereby resulting in a distorted etching pattern.

Figure 6B:
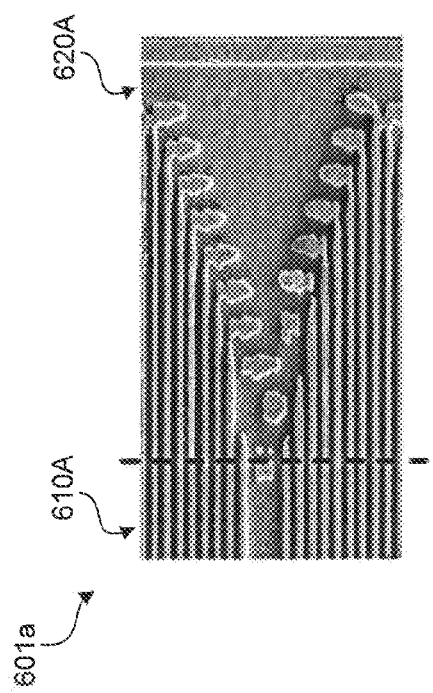
FIGS. 6A and 6B illustrate a comparison between a semiconductor pattern formed with a conventional photomask versus a semiconductor pattern formed with the exemplary photomask.
Figure 6A:
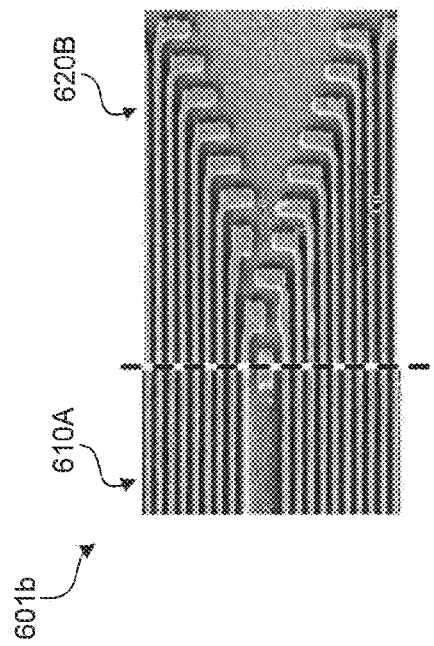

An example of this can be seen in FIG. 6A, which illustrates a wafer surface resulting from performing photolithography using a conventional photomask. The vertical line 601a represents a transmission between a first area 610A and a second area 620A. The first area 610A may be raised (nearer to the projection lens) or recessed (further from the projection lens) relative to the second area 620A. As a result, a focal plane of the first area 610A differs from a focal plane of the second area 620A. Therefore, as shown in FIG. 6A, when the projection lens is configured to focus light for the focal plane of the first area 610A, the second area 620A becomes "out of focus," and an inaccurate ("blurry") pattern results.

The exemplary photomask 110 described herein has been devised to address these issues, and to improve overall photolithography patterning of semiconductor wafers, particularly of semiconductor wafers having a surface with multiple areas of differing heights (e.g., non-uniform focal planes).

Photomask

Figure 3:
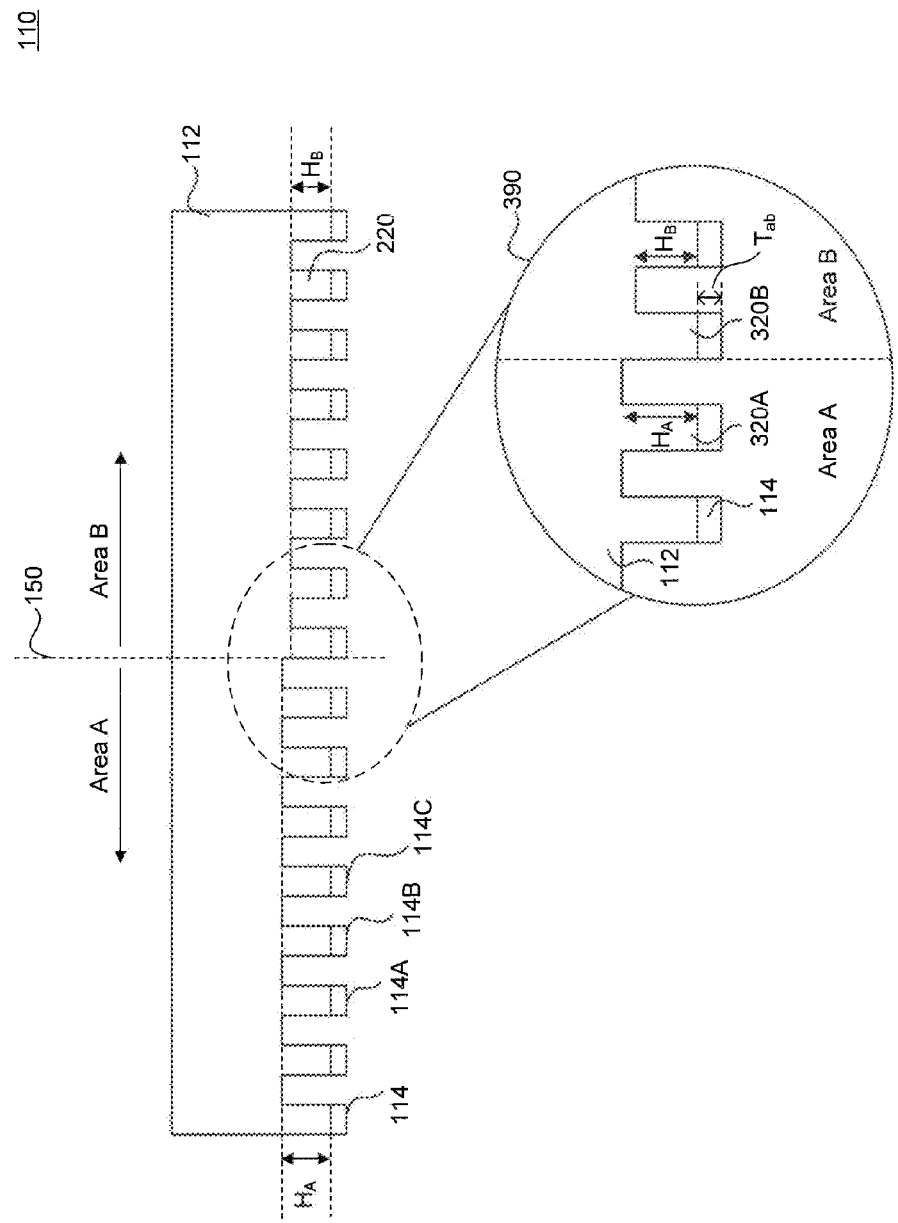
FIG. 3 illustrates a cross-sectional view of an exemplary multi-shifting photomask according to an exemplary embodiment.

FIG. 3 illustrates the exemplary photomask 110 according to an exemplary embodiment. The photomask 110 includes the substrate 112 and the absorber 114 disposed on a light-exit surface of the substrate 112. The substrate 112 has a substantially planar incident surface (illustrated as the upper surface in FIG. 3). Opposite the incident surface, the substrate has a light-exit surface that includes a plurality of protrusions 320 arranged in a tooth-like manner. In an embodiment, the protrusions 320 are integrally formed with the substrate 112. These protrusions 320 can be designed to compensate for differences in focal areas of the semiconductor device, as will be discussed in further detail below.

The absorber 114 includes a plurality of absorber portions (e.g., 114A, 114B, and 114C) disposed on the surfaces of the substrate protrusions 320. These portions of the absorber 114 each have substantially the same thickness $T_{Ab}$, and are disposed on a substantially even horizontal plane relative to their longitudinal axes. In other words, in an embodiment, each of the substrate protrusions 120 extend along a common plane, on which the absorber portions reside. By adjusting the depths of the protrusions relative to this common plane, the photomask 110 can account for differing focal planes of the semiconductor device.

As discussed above with respect to FIG. 2, a first area 210A of a semiconductor device 150 may have a different height (and therefore a different focal plane) relative to a second area 210B of the semiconductor device 150. By adjusting the depths of the protrusions 320 of the photomask 110, these differences in the focal planes can be accounted for to provide a focused exposure in all areas. For example, in FIG. 3, an imaginary dividing line 150 is illustrated as separating the photomask 110 into a first area (Area A) that corresponds to the first area 210A of the semiconductor device 150, and a second area (Area B) that corresponds to the second area 210B of the semiconductor device 150.

In Area A of the photomask 110, the protrusions 320 have a depth $H_A$, whereas in Area B of the photomask 110, the protrusions 320 have a depth $H_B$, where $H_A > H_B$. By forming the light-exit surface of the photomask 110 in this manner, the focal plane of the Area A will be raised (e.g., closer to the photomask 110) relative to the focal plane of the Area B.

A magnified view 390 is provided in FIG. 3 to more clearly illustrate these features. As shown in the magnified view 390, a first protrusion 320A in the Area A has a depth $H_A$ relative to the bottom horizontal plane. Likewise, a second protrusion 320B in the Area B has a depth $H_B$ relative to the bottom of the horizontal plane. By manufacturing the protrusions 320 in the Area A to have the depth $H_A$, the focal plane of the Area A can be adjusted corresponding to the height of the first area 210A of the semiconductor device 150. Similarly, by manufacturing the protrusions 320 in the Area B to have the depth $H_B$, the focal plane of the Area B can be adjusted corresponding to the height of the second area 210B of the semiconductor device 150.

Photomask Design

As discussed above, different areas of the photomask 110 can be designed to have different focal planes corresponding to different areas of the semiconductor device 150. The process of calculating and designing the photomask according to the height differences of the semiconductor device 150 is described in detail herein.

As shown in the magnified view 190 of FIG. 3, the absorber 114 has a thickness $T_{Ab}$, the first protrusions 320A in a first Area A have a depth $H_A$, and the second protrusions 320B in a second Area B have a depth $H_B$. A phase angle of the transmitted light can be calculated as:

$$\theta = \frac{2\pi}{\lambda}[(\eta_s - 1) \cdot H_s + (\eta_{ab} - 1) \cdot T_{Ab}], \quad (1)$$

where $\eta s$ is the refractive index of the substrate 112, $\eta ab$ is the refractive index of the absorber 114, and Hs is the depth of the protrusions in a particular area. For example, in Area A of the photomask 110, Hs would be set to be equal to $H_A$. The calculated phase θ is the phase shift from 180 degrees. In other words, a calculated phase angle θ of 2.5 degrees corresponds to a total phase shift of 182.5 degrees, whereas a calculated phase angle θ of −2.5 degrees corresponds to a total phase shift of 177.5 degrees.

Figure 7:
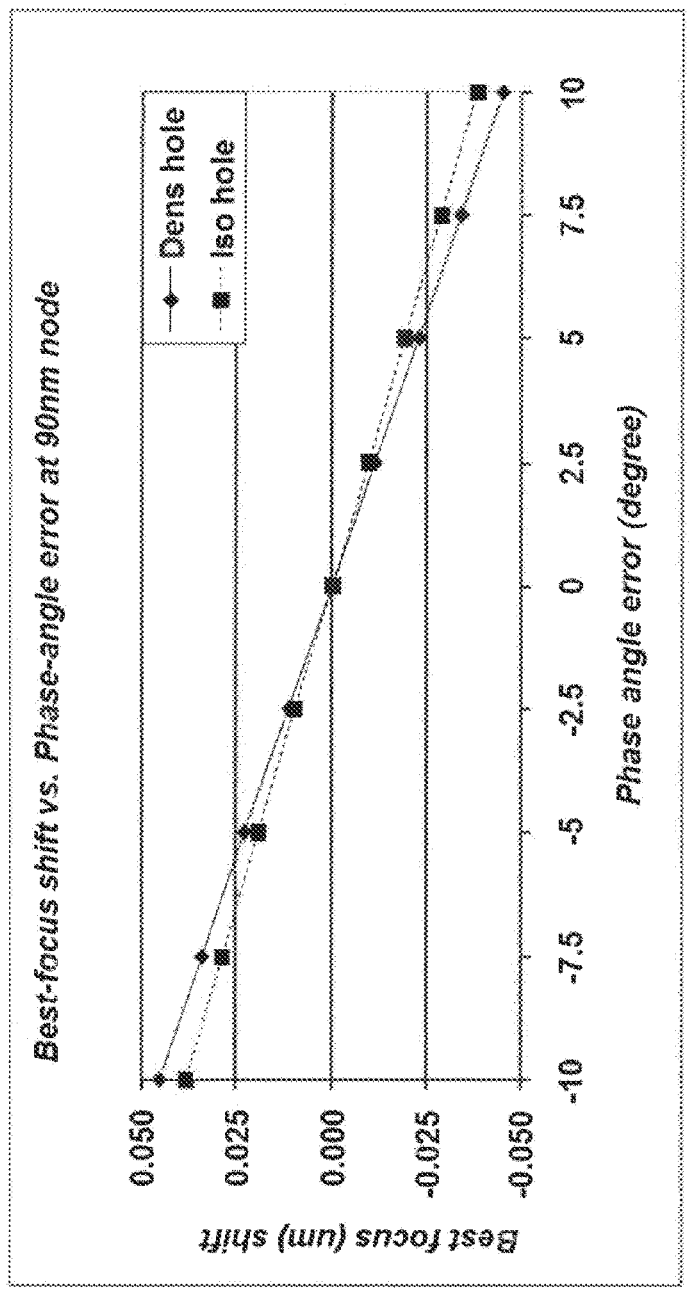
FIG. 7 illustrates a graphical representation of the phase-shift caused by the exemplary photomask versus an adjusted focal plane corresponding thereto.

Adjusting the phase angle of the light passing through the photomask 110 causes a corresponding adjustment to the focal plane in that area. FIG. 7 illustrates a graphical representation of the relationship between the phase angle θ and the focal plane. As shown in FIG. 7, the focal plane shifts inversely proportional to the phase shift. Thus, as the phase shift increases, the focal plane decreases (is set further away from the photomask 110). For example, a phase shift of 2.5 degrees results in the focal plane being shifted by −0.025 um (0.025 um further from the photomask 110). The values depicted in FIG. 7 are for illustrative purposes only, and are not meant to be exact.

Using the properties of the photomask 110 described above, the photomask can be designed to compensate for areas of the semiconductor device having different heights. For example, for areas of the semiconductor device 150 that are raised (e.g., first area 210A), corresponding areas of the photomask 110 (e.g., Area A) can be set to have a phase angle θ that is less than 0 degrees. Using equation (1), above, the depth of the protrusions in the Area A can be calculated accordingly. Similarly, for areas of the semiconductor device 150 that are recessed (e.g., second area 210B), corresponding areas of the photomask 110 (e.g., Area B) can be set to have a phase angle θ that is greater than 0 degrees.

It should be noted that, in practice, a substantial portion of the semiconductor device may be at the same surface height, with smaller localized areas having other different heights. In this scenario, the photomask 110 may have a primary focal plane even with the surface height of that substantial portion. Other areas of the photomask 110 corresponding to the differing localized areas of the semiconductor device 150 can then be designed to have deeper or shallower depths of protrusions so as to adjust the focal planes accordingly in those areas.

Figure 4:
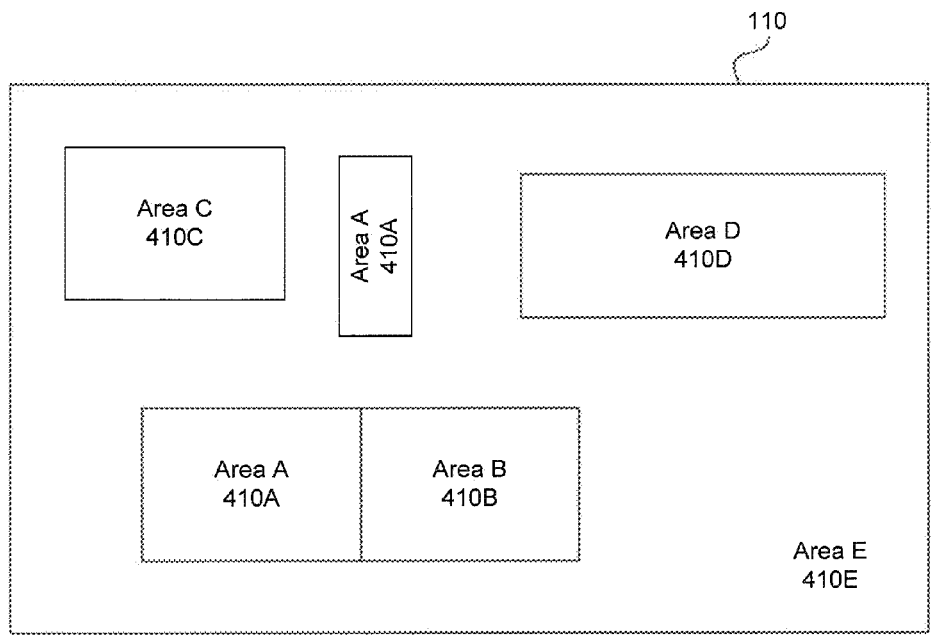
FIG. 4 illustrates a plan view of the exemplary photomask according to an exemplary embodiment.

FIG. 4 provides an example of such a photomask 110. As shown in FIG. 4, the photomask 110 has a primary area 410E (Area E) that is constructed to be at a zero degree phase shift (from 180 degrees). Other localized areas 410A-410D are then constructed with varying protrusion depths according to whether corresponding areas of the semiconductor device are recessed or raised from a primary plane of the semiconductor device. As shown, more than one separate localized area may have the same design needs. For example, there are two distinct Area A's 410A that will be constructed to the same specifications in the example of FIG. 4.

By constructing the photomask 110 to compensate for the different focal planes of the semiconductor wafer, an accurate pattern can be etched over all areas. An example of this can be seen in FIG. 6B, which illustrates a wafer surface resulting from performing photolithography using an exemplary photomask according to an embodiment. The vertical line 601b represents a transition between a first area 610B and a second area 620B. The first area 610B may be raised (nearer to the projection lens) or recessed (further from the projection lens) relative to the second area 620B. As a result, a focal plane of the first area 610B differs from a focal plane of the second area 620B. However, as shown in FIG. 6B, when the projection lens is configured to perform the exposure using an exemplary photomask, both the first area 610A and the second area 620B are kept "in focus" and are accurately patterned.

Method for Preparing a Multi-Phase Shift Photomask

Figure 5:
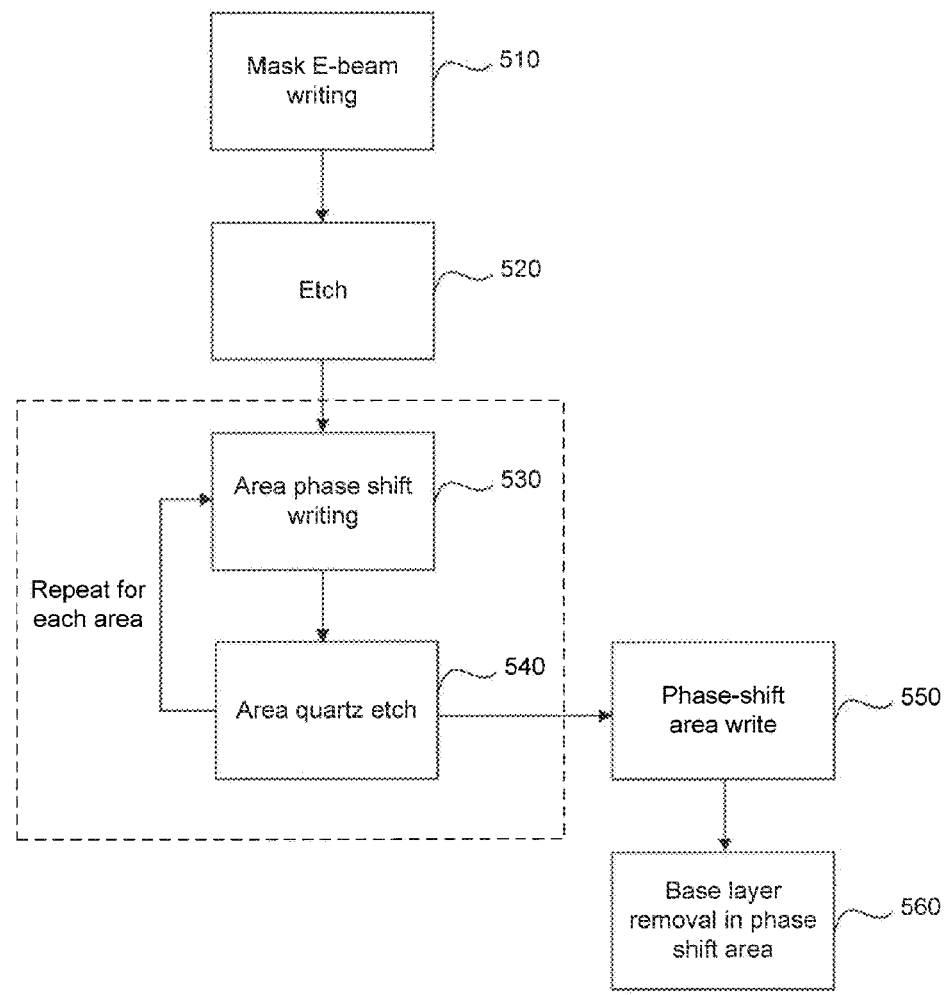
FIG. 5 illustrates an exemplary method for manufacturing a semiconductor device using the exemplary multi-shifting photomask according to an exemplary embodiment.

FIG. 5 illustrates an exemplary method 500 for preparing the multiple phase-shift photomask described herein. The method 500 will be described with respect to FIGS. 2-4 for illustrative purposes, although method 500 is not limited to this example.

In step 510, an electron beam writer is used to write a pattern onto a photomask plate. In step 520, the imaged pattern is then developed to form a template, following which a base material (e.g., Chrome and/or MoSI) is etched away based on the printed pattern.

Following the etch, according to an embodiment, in step 530 an area phase shift write is performed. This area phase shift write defines one or more focus adjustment areas (e.g., 410A in FIG. 4). After the area phase shift write, an area substrate etch is performed in step 540. The area substrate etch etches away the substrate in the current area to a desired depth in order to achieve the desired phase shift (according to equation (1), above). The area phase shift write and the area substrate etch (steps 530 and 540) are steps performed specifically to achieve the area phase shifts described above with respect to the exemplary embodiments, and are repeated as necessary for each focal area. In an embodiment, these steps are repeated for each individual area regardless of whether any of those areas are to be etched to the same depths, and in another embodiment, these steps are performed for multiple areas that are to have the same depths at the same time.

In step 550, after the phase shift area write and the area substrate etch have been performed for all the areas, a general phase shift area write is performed. In step 560, a base layer is removed in the phase shift areas, after which the method concludes.

Method and Apparatus for Exposing a Semiconductor Wafer Using the Exemplary Photomask The setup and process for exposing a semiconductor device using the exemplary photomask described herein is detailed below with reference to FIGS. 1, 2 and 4.

As discussed above, the exemplary multi-phase photomask is designed with areas of different phase-shift properties in correspondence with areas of a semiconductor device that lie in different focal planes (see FIGS. 2 and 4). In other words, based on design specifications, the semiconductor device will have some surface areas that are raised/lowered with respect to other surface areas, as shown in FIG. 2. As shown in FIG. 4, for example, the exemplary photomask can be designed to include corresponding areas that adjust the phase of transmitted light so as to focus the light at each of the focal planes of the semiconductor areas.

Therefore, when seeking to perform photolithography of a semiconductor device having multiple areas of differing focal planes, the exemplary photomask can be disposed in an exposure apparatus, such as the photolithography apparatus 100 illustrated in FIG. 1. With reference to FIG. 1, the photolithography apparatus 100 includes a light source (not shown) that emits incident light 102. The photomask is disposed in the path of this light. Light that is transmitted from the photomask will be focused by a projection lens 120 onto the surface of the semiconductor device 150.

The photomask should be positioned in the apparatus such that its phase shift areas are optically aligned with the corresponding focal plane areas of the semiconductor device. In other words, the photomask should be positioned such that substantially all light transmitted by a first phase shift area of the photomask will be focused by the projection lens 120 onto the corresponding focal plane area of the semiconductor device. Additionally, in an embodiment, the photomask is also positioned at such a distance from the projection lens 120 that the light focused by the projection lens will be substantially "in-focus" at each of the focal plane areas of the semiconductor device. In an embodiment, the photomask can be focally positioned by determining that light transmitted by a primary phase-shift area of the photomask is in-focus on the primary focal plane of the semiconductor device.

Once properly positioned, the photolithography apparatus 100 can expose the semiconductor device 150 by emitting high intensity light from its light source. This light will become incident upon the exemplary photomask, and redirected by the projection lens to a surface of the semiconductor device 150. Due to the unique properties of the exemplary photomask, the exposure produces sharp and accurate patterns over all areas of the semiconductor device 150, regardless of whether they are recessed/raised relative to other areas.

Several advantages are achieved through the use of the exemplary photomask. For example, because the photomask allows for the transmitted light to be focused across all areas of the exposure medium, sharp and accurate features can be etched. This substantially improves manufacturing yield, and reduces manufacturing defects. In addition, because the exposure can be performed simultaneously for all areas of the exposure medium, the photomask can be used in existing photolithography apparatuses without significant added cost or difficulty. Several other advantages will be apparent to those of ordinary skill in the art.

CONCLUSION

It is to be appreciated that the Detailed Description section, and not the Summary and Abstract sections (if any), is intended to be used to interpret the claims. The Summary and Abstract sections (if any) may set forth one or more but not all exemplary embodiments of the invention as contemplated by the inventor(s), and thus, are not intended to limit the invention or the appended claims in any way.

While the invention has been described herein with reference to exemplary embodiments for exemplary fields and applications, it should be understood that the invention is not limited thereto. Other embodiments and modifications thereto are possible, and are within the scope and spirit of the invention. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the invention should not be limited by any of the above-described exemplary embodiments, but should be defined only in accordance with the following claims and their equivalents.

What is claimed is:

1. A photomask, comprising:
   a first area including a plurality of first protrusions formed in a surface of a substrate and having a first depth configured to shift a phase of first light incident thereon by a predetermined first phase angle, and to transmit the shifted first light; and
   a second area including a plurality of second protrusions formed in the surface of the substrate configured to shift a phase of second light incident thereon by a predetermined second phase angle different from the first phase angle, and to transmit the shifted second light,
   an absorber is disposed solely on distal end surfaces of the first protrusions and the second protrusions, wherein the absorber is configured to transmit the light transmitted through the first and second protrusions with a transmittance of not greater than 8%, and to shift a phase of light transmitted through the absorber by a phase angle of 180 degrees.

2. The photomask of claim 1, wherein the first depth is greater than the second depth.

3. The photomask of claim 2, wherein the first area causes the first light to focus at a first focal plane that is nearer to the photomask than a second plane at which the second light is caused to focus by the second area.

4. The photomask of claim 2, wherein the first area causes the first light to focus at a first focal plane that is further from the photomask than a second plane at which the second light is caused to focus by the second area.

5. The photomask of claim 1, wherein the absorber is configured to transmit the light transmitted through the first and second protrusions with a transmittance of 6-8%.

6. A photolithography apparatus for exposing an exposure medium, the exposure medium including a first area lying in a first focal plane and a second area lying in a second focal plane, the apparatus comprising:
   a light source configured to emit light;
   a photomask, disposed in a path of the emitted light, configured to adjust the emitted light, the photomask including:
   a first phase-shift area including a plurality of first protrusions formed in a surface of a substrate and having a first depth configured to shift a phase of the emitted light incident thereon by a first phase-shift,
   a second phase-shift area including a plurality of second protrusions formed in the surface of the substrate and having a second depth configured to shift a phase of the emitted light incident thereon by a second phase-shift;
   an absorber is disposed solely on distal end surfaces of the first protrusions and the second protrusions, wherein the absorber is configured to transmit the light transmitted through the first and second protrusions with a transmittance of not greater than 8%; and
   a projection lens configured to focus the adjusted light toward the exposure medium,
   wherein the photomask includes a primary phase-shift area configured to shift a phase of the emitted light incident thereon by a primary phase-shift, and wherein the first and second phase-shifts are shifted by less than 180 degrees from the primary phase-shift and from each other.

7. The photolithography apparatus of claim 6, wherein the first phase-shift area is optically aligned with the first area of the exposure medium, and wherein the second phase-shift area is optically aligned with the second area of the exposure medium.

8. The photolithography apparatus of claim 6, wherein the photomask is configured to adjust the emitted light by shifting a phase of the transmitted light.

9. The photolithography apparatus of claim 6, wherein the primary phase-shift area has a largest surface area from among all phase-shift areas of the photomask, and wherein the photomask is positioned in the photolithography apparatus such that the primary phase-shift area is focally and optically aligned with a corresponding primary area of the exposure apparatus.

10. The photolithography apparatus of claim 9, wherein the primary phase-shift area causes a 180 degree phase-shift to the emitted light transmitted therethrough.

11. The photolithography apparatus of claim 6, wherein the absorber is configured to transmit the light transmitted through the first and second protrusions with a transmittance of 6-8%.

12. The photolithography apparatus of claim 6, wherein the first and second phase-shifts are shifted by less than 20 degrees from each other.

13. The photolithography apparatus of claim 12, wherein the first and second phase-shifts are each shifted by less than 10 degrees from the primary phase-shift.

* * * * *